United States Patent
Handy

(10) Patent No.: US 10,422,826 B2
(45) Date of Patent: Sep. 24, 2019

(54) LOCATING ELECTRICAL FAULTS IN A CIRCUIT

(71) Applicant: GE Aviation Systems Limited, Cheltenham, Gloucestershire (GB)

(72) Inventor: Peter James Handy, Cheltenham (GB)

(73) Assignee: GE Aviation Systems Limited, Cheltenham, Gloucestershire (GB)

( * ) Notice: Subject to any disclaimer, the term of this patent is extended or adjusted under 35 U.S.C. 154(b) by 31 days.

(21) Appl. No.: 15/504,331

(22) PCT Filed: Sep. 1, 2015

(86) PCT No.: PCT/EP2015/069977
§ 371 (c)(1),
(2) Date: Feb. 16, 2017

(87) PCT Pub. No.: WO2016/034599
PCT Pub. Date: Mar. 10, 2016

(65) Prior Publication Data
US 2017/0234921 A1    Aug. 17, 2017

(30) Foreign Application Priority Data
Sep. 2, 2014 (GB) .................................. 1415506.3

(51) Int. Cl.
*G01R 1/00* (2006.01)
*G01R 31/11* (2006.01)
(Continued)

(52) U.S. Cl.
CPC ............ *G01R 31/11* (2013.01); *G01R 31/085* (2013.01); *G01R 1/00* (2013.01); *G05B 1/00* (2013.01); *G05B 2219/00* (2013.01)

(58) Field of Classification Search
CPC ........ G05B 1/00; G05B 2219/00; G01R 1/00; H04B 1/00; H04B 2201/00
See application file for complete search history.

(56) References Cited

U.S. PATENT DOCUMENTS

| 3,727,128 A | 4/1973 | McFerrin |
| 5,083,086 A | 1/1992 | Steiner |

(Continued)

FOREIGN PATENT DOCUMENTS

| CN | 2768017 Y | 3/2006 |
| CN | 201654167 U | 11/2010 |

(Continued)

OTHER PUBLICATIONS

"IEEE Guide for Fault Locating Techniques on Shielded Power Cable Systems," IEEE Power Engineering Society, pp. 1-35 (2007).

(Continued)

*Primary Examiner* — Jermele M Hollington
*Assistant Examiner* — Temilade S Rhodes-Vivour
(74) *Attorney, Agent, or Firm* — McGarry Bair PC

(57) ABSTRACT

The present embodiments are directed to locating electrical faults in an electrical circuit, in particular electrical faults in transmission wires of an electrical circuit. Examples of the present embodiments provide a method and apparatus for opening a switch in the electrical circuit to cause an open circuit or discontinuity at the fault; transmitting a signal to be reflected from the open circuit or discontinuity and receiving the signal reflected from the open circuit or discontinuity to determine the location of the fault. Examples are particularly suitable for high voltage systems, for example over 100V.

12 Claims, 3 Drawing Sheets

(51) Int. Cl.
*G01R 31/08* (2006.01)
*G05B 1/00* (2006.01)

(56) References Cited

U.S. PATENT DOCUMENTS

| | | |
|---|---|---|
| 8,842,398 B2 | 9/2014 | Shipley et al. |
| 2002/0196031 A1* | 12/2002 | Blades ............ G01R 1/07 324/536 |
| 2006/0012374 A1* | 1/2006 | Kojovic ............ G01R 31/085 324/522 |
| 2010/0211348 A1* | 8/2010 | Gray ............ G01R 31/11 702/124 |
| 2011/0043214 A1* | 2/2011 | Potter ............ G01R 31/085 324/525 |
| 2011/0181295 A1* | 7/2011 | Haugen ............ G01R 31/024 324/543 |
| 2011/0227581 A1* | 9/2011 | Kojovic ............ G01R 31/085 324/524 |
| 2011/0242989 A1* | 10/2011 | Kim ............ H04L 25/0266 370/242 |
| 2011/0292555 A1 | 12/2011 | Shipley |
| 2013/0003233 A1* | 1/2013 | Panetta ............ H02H 1/0015 361/42 |
| 2013/0057997 A1* | 3/2013 | Dent ............ G01R 31/024 361/118 |
| 2013/0124119 A1 | 5/2013 | Reynaud et al. |
| 2013/0187662 A1* | 7/2013 | Davis ............ G01R 31/024 324/521 |
| 2014/0028116 A1* | 1/2014 | O'Brien ............ H02H 3/02 307/130 |
| 2014/0233136 A1* | 8/2014 | Heerdt ............ H02H 1/0015 361/2 |
| 2015/0055263 A1* | 2/2015 | Tekletsadik ............ H02H 9/021 361/93.6 |
| 2016/0291073 A1 | 10/2016 | Handy et al. |

FOREIGN PATENT DOCUMENTS

| | | |
|---|---|---|
| CN | 102159956 A | 8/2011 |
| CN | 103217594 A | 7/2013 |
| GB | 2 082 866 A | 3/1982 |
| SU | 1307401 A1 | 4/1987 |

OTHER PUBLICATIONS

Combined Search and Examination Report issued in connection with corresponding GB Application No. 1415506.3 dated Feb. 26, 2015.

International Search Report and Written Opinion issued in connection with corresponding PCT Application No. PCT/EP2015/069977 dated Dec. 2, 2015.

Examination Report issued in connection with corresponding GB Application No. 1415506.3 dated Dec. 1, 2016.

International Preliminary Report on Patentability issued in connection with corresponding PCT Application No. PCT/EP2015/069977 dated Mar. 7, 2017.

First Office Action and Search issued in connection with corresponding CN Application No. 201580047194.3 dated Sep. 30, 2018.

* cited by examiner

LOCATING ELECTRICAL FAULTS IN A CIRCUIT

BACKGROUND

The present disclosure is directed to locating electrical faults in an electrical circuit, in particular electrical faults in transmission wires of an electrical circuit.

Many electrical systems, such as those in an aircraft power distribution system use long transmission wires, often hundreds of meters or kilometers in length, to deliver power from electrical power sources to electrical loads. However, the long transmission wires can experience faults which need to be repaired. Attempts have been made to identify the location of a fault on live transmission wires in an electric circuit using "reflectometry". This technique involves measuring the time taken for a signal to be reflected from a discontinuity or an open circuit at a fault. Knowing the speed at which the signal travels, the location of the fault may be determined from the time taken for the reflected signal to return from the discontinuity.

However, it has been found that the "reflectometry" technique is only suitable in particular situations, such as for faults in low voltage applications. The inability to reliably detect the location of a fault in an electrical system leads to time consuming investigations to determine the location of faults requiring the electrical systems to be shut down which is inconvenient.

BRIEF DESCRIPTION

According to a first aspect of the present disclosure there is provided a method of locating a fault in a live electrical circuit having transmission wires, the method comprising opening a switch in the electrical circuit to cause an open circuit or discontinuity at the fault; transmitting a signal to be reflected from the open circuit or discontinuity and receiving the signal reflected from the open circuit or discontinuity to determine the location of the fault.

By opening a switch in the electrical circuit to provide an open circuit or discontinuity at the fault, the location of faults in electrical systems which have not previously been reliably detectable, such as in high voltage circuits where arcing across the fault prevents a clear open circuit or discontinuity from being generated, may now be detected. Examples are particularly suitable for high voltage systems, for example of 100V or more.

According to a second aspect of the present disclosure there is provided an apparatus for locating a fault in an electrical circuit having transmission wires, the apparatus comprising a controller for opening a switch in the electrical circuit to cause an open circuit or discontinuity at the fault; transmitting a signal to be reflected by the open circuit or discontinuity; and receiving the signal reflected from the open circuit or discontinuity to determine the location of the fault.

BRIEF DESCRIPTION OF THE DRAWINGS

Embodiments of the present disclosure will now be described, by way of example only, with reference to the accompanying drawings, in which.

DETAILED DESCRIPTION

Figure 1:
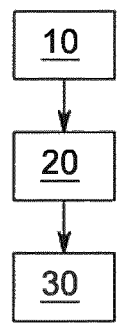
FIG. 1 is a flow diagram showing an example of locating a fault in an electrical system according to an embodiment.

FIG. 1 shows an example of locating a fault in an electrical circuit having transmission wires. At step 10 a switch in the electrical circuit is opened. This leads to the voltage in the electrical circuit falling along with the arc current across the fault until the arc current has fallen sufficiently to quench the arc causing an open circuit or discontinuity at the fault. At step 20 a signal transmitted into the circuit is reflected from the open circuit or discontinuity at the fault. At step 30 the signal reflected from the open circuit or discontinuity is received to determine the location of the fault. For example if the signal is known to travel in the transmission wires at a known speed, the time taken by the reflected signal can be used to determine the distance to and thus the location of the fault.

Figure 2:
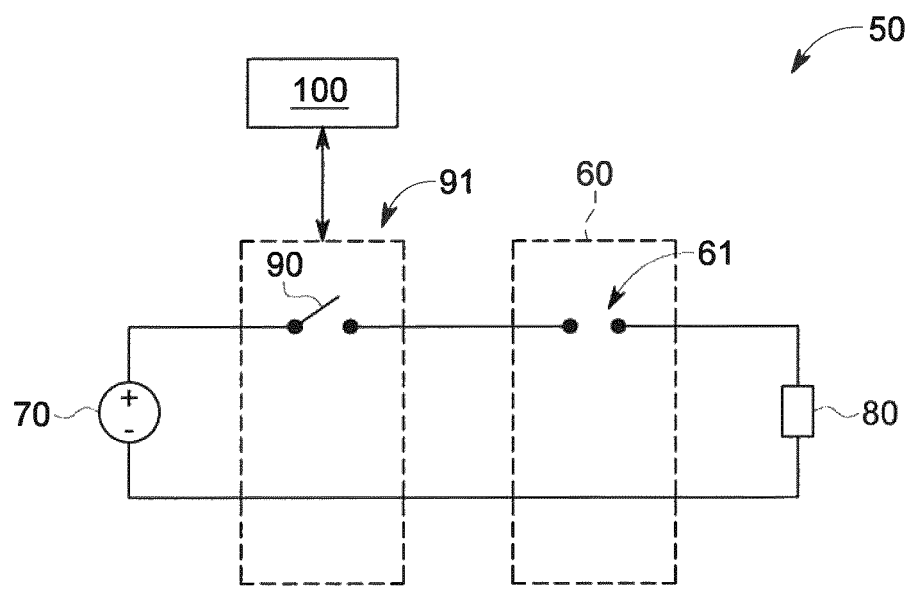
FIG. 2 shows an example of an electrical system according to an embodiment.

FIG. 2 shows an example of an electrical circuit according to an embodiment. The circuit includes a length of electrical wiring 60. The electrical wiring 60 may be for example be in a vehicle such as an aircraft, ship etc or in a factory, hospital or other facility. FIG. 2 shows a fault 61 that has occurred in the wiring 60. The circuit 50 also includes an electrical power source 70 and an electrical load 80 connected to each other by the wiring 60. A switch 90 is also provided in the electrical wiring 60. The switch 90 may be part of some associated equipment 91 forming part of the circuit, such as a solid state power controller (SSPC), the power generator 70 or a current transformer for example.

In order to determine the location of the fault 61 in the electrical wiring 60, which can extend to considerable lengths such as some kilometers, the switch 90 is opened by a controller in an arc fault location device 100 which leads to the voltage and current in the electrical circuit 50 falling. When the current in the arc across the fault 61 falls, typically to 200-400 mA for a short arc (but to different currents depending on the size of the gap) the arc quenches resulting in an open circuit. The arc quench produces a very fast drop in current in the electrical circuit 50 resulting in a change in impedance of the wiring 60 as the arc has now been replaced by an air gap. A signal from the controller in the arc fault location device 100 provided to the wiring 60 of the electrical circuit 50 is reflected by the change in impedance of the wiring 60 caused by the arc quench at the fault 61. The reflected signal is received, in this case by the arc fault location device 100, but it could be received by another component at the same or some other location in the circuit 50. The time taken for the signal to travel from the arc fault location device 100 to and back from the fault 61 is determined and knowing the speed at which the signal travels in the wiring 60, the distance to and thus the location of the fault 61 may be calculated. The method of locating the fault 61 may be repeated to determine the location even more precisely.

Figure 3:
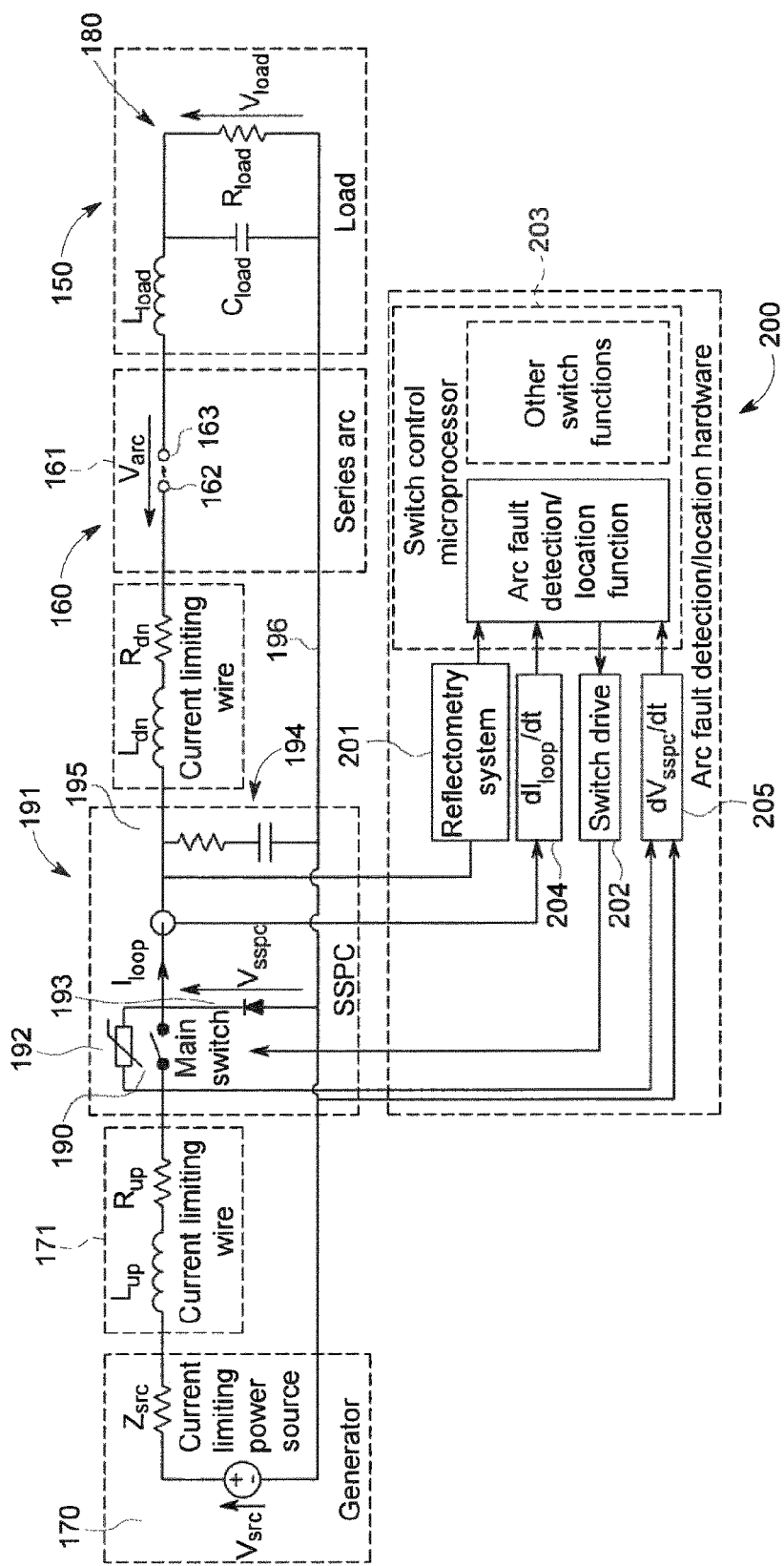
FIG. 3 is a more detailed example of an electrical system according to an embodiment.
Figure 4:
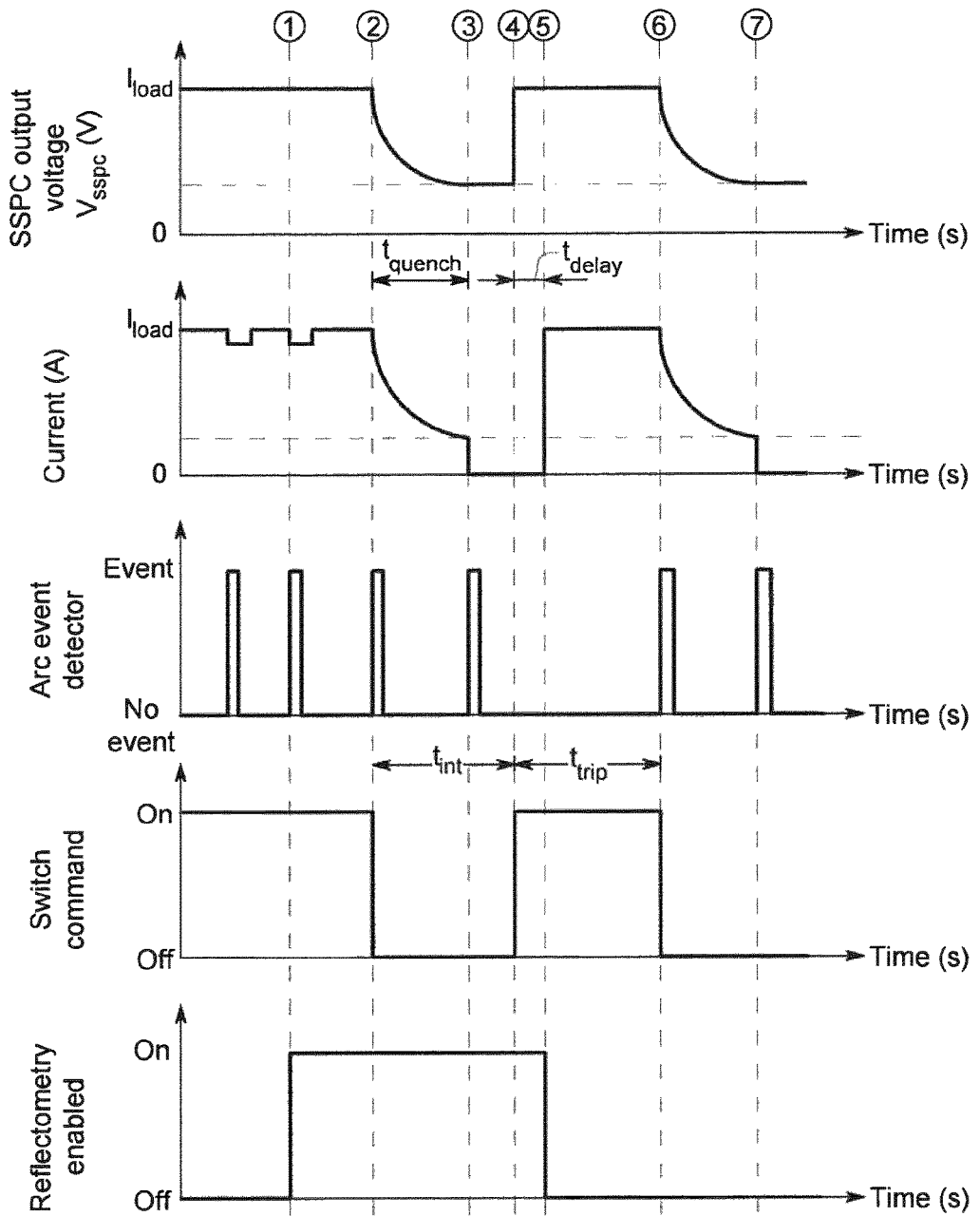
FIG. 4 is a series of graphs showing the response at various points in the electrical system of FIG. 3 during the location of an electrical fault.

FIG. 3 illustrates a typical DC aircraft electrical power distribution circuit 150, having a Solid State Power Controller (SSPC) device 191 with a switch 190. The SSPC device 191 of this example has arc fault detection (AFD) capability. Arc fault location capability is provided by an arc fault location device 200 including a reflectometry system 201. FIG. 4 shows waveforms of electrical characteristics at various points in the circuit 150.

A power source, in this example in the form of an electrical generator 170 with voltage $V_{src}$ and inherent output impedance $Z_{src}$ is provided. When used in an aircraft, an operating gas turbine engine may provide mechanical energy which may be used to provide a driving force for the generator 170.

The generator 170 is connected to the SSPC 191 by upstream current limiting wiring 171 with inherent inductance $L_{up}$ and resistance $R_{up}$. In this example the main switch 190 is provided with a transorb 192 and a diode 193 to suppress any transient electrical signal generated when the switch is opened.

The wiring 161 between the switch 190 and the electrical load 150 is shown with inherent inductance $L_{dn}$ and resistance $R_{dn}$. A fault 161 shown as a physical separation between two separated terminals 162, 163 is present in the wiring 160. A load 180 with inherent inductance $L_{load}$, resistance $R_{load}$ and capacitance $C_{load}$ is also shown.

The arc fault locating device 200 includes a reflectometry system 201 to transmit a signal into the electrical circuit 150 and to receive the signal reflected from the fault 161. The fault locating device 200 also has a switch device 202 to open and close the switch 190 and a microprocessor 203 to control the reflectometry system 201 and the switch device 202 and to calculate the distance to and thus the location of the fault 161. In this example current and voltage sensors 204, 205 are also shown which may be used to detect the occurrence of a fault 161. The microprocessor 203 of the example of FIG. 3 is arranged to control the function of arc fault detection and location as well as other switch functions which the particular circuit 150 may be arranged to perform depending upon its use.

Prior to time (1) in FIG. 4, a series arc fault is present in the system. The presence of an arc fault may be detected by any method known to a person skilled in the art, such as by monitoring current and/or voltage of the circuit 150. Alternatively, the method of locating a fault may be performed periodically without the need to specifically detect that a fault has occurred beforehand.

At point (1) in FIG. 4, arc fault detection hardware in the SSPC device 191 of FIG. 3 has had sufficient time to flag a possible arc fault. In this example the presence of an arc fault may be determined by detecting the short current reduction caused by disconnection and then reconnection during arcing.

At point (1) in FIG. 4, the arc fault location device 200 is enabled. At this point it starts transmitting signals to be reflected by a fault in the circuit when the arcing at the fault has been quenched.

At point (2), the series arc fault is confirmed by a further short current reduction and the SSPC switch 190 is opened which leads to the SSPC 191 output voltage falling along with the arc current. At point (3) which occurs when the arc current is typically around 200-400 mA for short arcs, the arc quenches. Arc quench is characterised by a very fast negative dI/dt which is indicative that an arc fault is present. FIG. 3 shows a snubber 194 comprising a resistor and a capacitor in series between the output node 195 of the SSPC device 191 and ground 196. The snubber 194 ensures that the arc quenches at point (3) in FIG. 4. The quenching of the arc is seen by the reflectometry hardware 201 in the arc fault location device 200 as a gross change in the line impedance as the arc has now been replaced by an air gap.

A signal transmitted by the reflectometry system 201 is reflected from the open circuit or discontinuity at the fault 161 and received to measure the time taken for the signal to travel to the fault and back and determine the location of the fault. The microprocessor 203 in the device 200 calculates the distance from the device 200 to the fault 161 knowing the time taken for the round trip (double the distance between the device 200 and the fault 161) and the propagation speed of the signal in the cable using the formula:

$$\text{distance to fault} = \text{propagation speed} \times \text{time taken}/2$$

At point (4) the SSPC switch 190 is closed and the SSPC 191 output voltage rises to match the line voltage. At this point, the arc current does not rise because there remains a gap between each side of the electrodes 162, 163 shown in FIG. 3. At point (5), the voltage across the electrodes 162, 163 has risen sufficiently for arcing to occur between them and the loop current rises. The delay between points (4) and (5) is another indication that a series arc was present. At point (6) an arc has been confirmed and the SSPC switch 190 is tripped (opened). At point (7) loop current has fallen to zero. This confirmation/perturbation/location method (point (1) to point (5)) could be run multiple times to improve confidence further.

It has been found that power quality of 270VDC systems can support an interruption of 50 ms in accordance with Aerospace standard RTCA DO-160G. The interruption time required for the arc fault perturbation methodology to function correctly is approximately 100 microseconds which has an insignificant effect on power quality.

Generally speaking, reflectometry schemes required more time in order to detect faults which are further away due to an increase in roundtrip time. Assuming a propagation speed of approximately 0.66 speed of light and a maximum cable length of 100 m, the round trip time can be calculated as follows: round trip time=$2 \times \text{distance}/\text{speed}=2 \times 100/(0.66 \times 3 \times 10^8)=1$ microsecond. Therefore numerous reflectometry signals can be used in order to monitor for cable breaks. For example, numerous reflectometry signals can be used after the arc has been quenched at point (3) of FIG. 4 during t_delay.

Many variations may be made to the examples described above whilst still falling within the scope of the present disclosure. For example, the switch 190 may be an independent component or may be provided as part of an existing device in a circuit, such as an SSPC device or a power generator. As well as locating a fault in wiring in an aircraft, the method disclosed herein may be used locate wiring faults in other situations such as ships, factories, hospitals and other facilities such as in solar or photovoltaic facilities. The signal to be reflected by the open circuit or discontinuity may be transmitted at any suitable time, such as by being repeatedly transmitted from before the switch is opened or as the switch is opened. It may be repeatedly transmitted until after a reflected signal has been received or until or after the switch has been subsequently closed.

What is claimed is:

1. A method of locating a fault in an electrical circuit having transmission wires, the method comprising:
   opening a switch in the electrical circuit to cause an open circuit or discontinuity at the fault;
   transmitting a signal to be reflected from the open circuit or discontinuity; and
   receiving the signal reflected from the open circuit or discontinuity to determine the location of the fault;
   wherein a snubber is provided between an output of the switch and the ground.

2. The method of claim 1, wherein opening the switch in the electrical circuit causes the voltage in the circuit to drop, quenching arcing across the fault resulting in an open circuit at the fault at which the transmitted signal is reflected.

3. The method of claim 2, wherein the signal is transmitted repeatedly from before the switch is opened.

4. The method of claim 1, wherein the signal is transmitted repeatedly from before the switch is opened.

5. The method of claim 1, wherein the electrical circuit is carrying electricity.

6. The method of claim 1, wherein the location of the fault is determined by measuring the time taken for the transmitted signal to be reflected by the open circuit or discontinuity and received and using the predetermined speed at which the signal travels in the transmission wires of the circuit.

7. The method of claim 6, wherein the distance to the fault from where the signal is transmitted is determined using:

$$\text{distance to fault} = \text{propagation speed} \times \text{time taken}/2.$$

8. An apparatus for locating a fault in a direct current (DC) electrical circuit having transmission wires, the apparatus comprising:
   a controller configured to:
      open a switch in the DC electrical circuit to cause an open circuit or discontinuity at the fault,
      transmit a signal to be reflected by the open circuit or discontinuity; and
      receive the signal reflected from the open circuit or discontinuity to determine the location of the fault; and
   a snubber is provided between an output of the switch and the ground.

9. The apparatus of claim 8, wherein the controller is further configured to transmit the signal repeatedly before opening the switch.

10. The apparatus of claim 9, wherein the controller is further configured to determine the location of the fault by measuring the time taken for the transmitted signal to be reflected by the open circuit or discontinuity and received, and by using the predetermined speed at which the signal travels in the transmission wires.

11. The apparatus of claim 8, wherein the controller is further configured to determine the location of the fault by measuring the time taken for the transmitted signal to be reflected by the open circuit or discontinuity and received, and by using the predetermined speed at which the signal travels in the transmission wires.

12. The apparatus of claim 11, wherein the distance to the fault from where the signal is transmitted is determined using:

$$\text{distance to fault} = \text{propagation speed} \times \text{time taken}/2.$$

* * * * *